United States Patent
Pan et al.

(10) Patent No.: US 8,691,630 B2
(45) Date of Patent: Apr. 8, 2014

(54) SEMICONDUCTOR PACKAGE STRUCTURE AND MANUFACTURING METHOD THEREOF

(71) Applicant: ChipMOS Technologies Inc., Hsinchu (TW)

(72) Inventors: Yu-Tang Pan, Hsinchu (TW); Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 13/647,406

(22) Filed: Oct. 9, 2012

(65) Prior Publication Data
US 2013/0140686 A1    Jun. 6, 2013

(30) Foreign Application Priority Data
Dec. 2, 2011    (TW) .............................. 100144388 A

(51) Int. Cl.
*H01L 21/00*    (2006.01)
(52) U.S. Cl.
USPC .......... 438/123; 438/112; 438/127; 257/676; 257/783
(58) Field of Classification Search
USPC ......... 257/666, 669, 670, 777, 671, 778, 779, 257/780, 781, 782, 783, 784, 786, 672, 675, 257/787, 788, 792, 793, 676, 678, 690, 692, 257/693, 704, 706, 707, 712, 713; 438/123, 438/111, 110, 108, 127, 106, 112, 118, 124, 438/126
See application file for complete search history.

(56) References Cited

U.S. PATENT DOCUMENTS

| | | | | |
|---|---|---|---|---|
| 5,834,831 | A * | 11/1998 | Kubota et al. | 257/674 |
| 6,337,510 | B1 | 1/2002 | Chun-Jen et al. | |
| 7,317,243 | B2 * | 1/2008 | Wang | 257/668 |
| 2004/0011699 | A1 * | 1/2004 | Park | 206/710 |
| 2005/0133896 | A1 * | 6/2005 | Liu et al. | 257/678 |
| 2008/0093717 | A1 * | 4/2008 | Huang et al. | 257/673 |

* cited by examiner

*Primary Examiner* — Thanh Y Tran
(74) *Attorney, Agent, or Firm* — Jianq Chyun IP Office

(57) ABSTRACT

A method of manufacturing a semiconductor package structure is provided. A heat-conductive block is adhered to a portion of a second surface of a conductive substrate via a first adhesive layer. An opening is formed by performing a half-etching process on a first surface of the conductive substrate. The remaining conductive substrate is patterned to form leads and expose a portion of the heat-conductive block. Each lead has a first portion and a second portion. A thickness of the first portion is greater than a thickness of the second portion. A first lower surface of the first portion and a second lower surface of the second portion are coplanar. A chip is disposed on the exposed portion of the heat-conductive block and electrically connected to the second portions of the leads. A first bottom surface of the heat-conductive block and a second bottom surface of a molding compound are coplanar.

10 Claims, 4 Drawing Sheets

SEMICONDUCTOR PACKAGE STRUCTURE AND MANUFACTURING METHOD THEREOF

CROSS-REFERENCE TO RELATED APPLICATION

This application claims the priority benefit of Taiwan application Ser. No. 100144388, filed on Dec. 2, 2011. The entirety of the above-mentioned patent application is hereby incorporated by reference herein and made a part of this specification.

BACKGROUND OF THE INVENTION

1. Field of the Invention

The invention relates to a semiconductor device and a manufacturing method thereof. More particularly, the invention relates to a semiconductor package structure and a manufacturing method thereof.

2. Description of Related Art

A chip package serves to protect bare chips, lower chip contact density, and ensure favorable heat dissipation of chips. Conventional packaging methods include installing chips to lead frames or circuit boards through wire bonding or flip chip bonding, so that the contacts on the chips may be electrically connected to the lead frames or the circuit boards. Therefore, the contacts of the chips can be re-distributed through the lead frames or the circuit boards, so as to satisfy the contact distribution of external devices of next hierarchy.

However, dimensions of chips are reduced little by little due to the advancement of technology and the miniaturization of components. As the dimensions of chips are reduced, the distance between the chips and leads of the lead frames is relatively increased, and so is the length of bonding wires connecting the chips and the leads. Thereby, transmission signals of components may be degraded, electrical performance may be reduced, and manufacturing costs may be increased Moreover, the bonding wires with long length may encounter issues of wire collapse or wire sweep during the molding process, which may pose a negative impact on the reliability of products.

SUMMARY OF THE INVENTION

The invention is directed to a semiconductor package structure with favorable reliability.

The invention is further directed to a method of manufacturing a semiconductor package structure for manufacturing the aforesaid semiconductor package structure.

In an embodiment of the invention, a method of manufacturing a semiconductor package structure is provided. The method includes following steps. A conductive substrate is provided. Here, the conductive substrate has a first surface and a second surface opposite to the first surface. A heat-conductive block is adhered to a portion of the second surface of the conductive substrate via a first adhesive layer. A portion of the conductive substrate is removed by performing a half-etching process on the first surface of the conductive substrate, and an opening is formed on the first surface of the conductive substrate. The remaining conductive substrate is patterned to form a plurality of leads electrically insulated from one another, and a portion of the heat-conductive block is exposed. Each of the leads has a first portion and a second portion, a thickness of the first portion is greater than a thickness of the second portion, and a first lower surface of the first portion and a second lower surface of the second portion are coplanar. A chip is disposed on the exposed portion of the heat-conductive block. Here, the second portions of the leads neighbor and surround the chip, and the chip is electrically connected to the second portions of the leads. A molding compound is formed to encapsulate the chip, a portion of the leads, and the exposed portion of the heat-conductive block.

In an embodiment of the invention, a semiconductor package structure that includes a heat-conductive block, a plurality of leads, a first adhesive layer, a chip, and a molding compound is provided. The heat-conductive block has a first top surface and a first bottom surface opposite to the first top surface. The leads are disposed on the first top surface of the heat-conductive block and expose a portion of the first top surface. The leads are electrically insulated from one another, and each of the leads has a first portion and a second portion. A thickness of the first portion is greater than a thickness of the second portion, and a first lower surface of the first portion and a second lower surface of the second portion are coplanar. The first adhesive layer is disposed between the leads and the heat-conductive block. The chip is disposed on the exposed portion of the first top surface of the heat-conductive block. Here, the second portions of the leads neighbor and surround the chip, and the chip is electrically connected to the second portions of the leads. The molding compound encapsulates the chip, a portion of the leads, and the exposed portion of the heat-conductive block.

Based on the above, as described in the embodiments of the invention, the half-etching process and the patterning process are performed on the conductive substrate to form the leads having the first and second portions, and the first and second portions have different thicknesses. Accordingly, when the chip is disposed on the heat-conductive block, the semiconductor package structure described in an embodiment of the invention can have favorable heat dissipation performance; what is more, the distance of bonding wires between the chip and the leads may be reduced during wire bonding due to the second portions of the leads neighboring and surrounding the chip. Thereby, the conventional issues of collapse of long wires or wire sweep can be resolved, and product reliability can be effectively improved. Moreover, when the chip is electrically connected to the second portions of the leads through flip chip bonding, the thickness of the package can be effectively reduced, such that the semiconductor package structure can have a relatively small package thickness.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
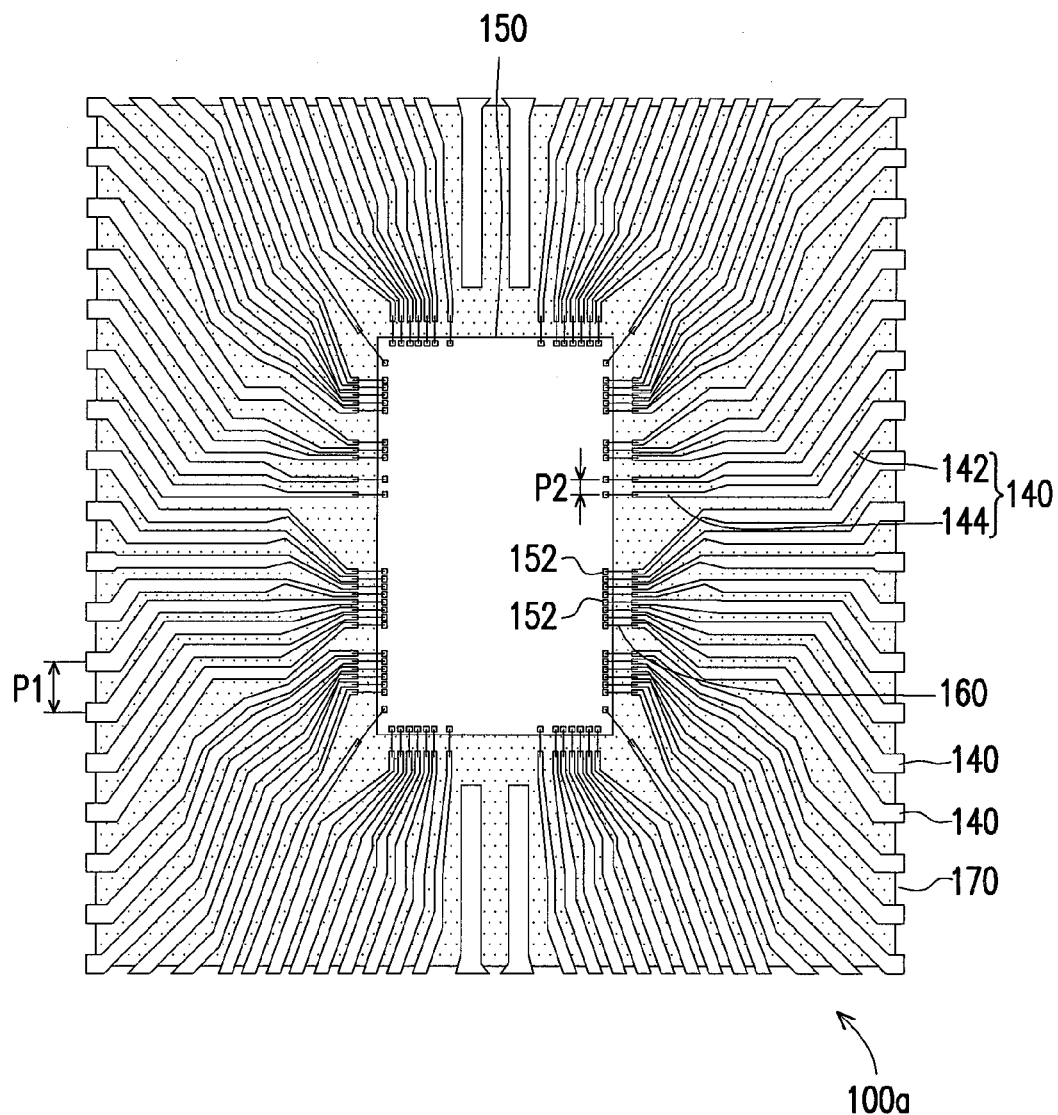
FIG. 1 is a schematic top view illustrating a semiconductor package structure according to an embodiment of the invention.
Figure 2A:
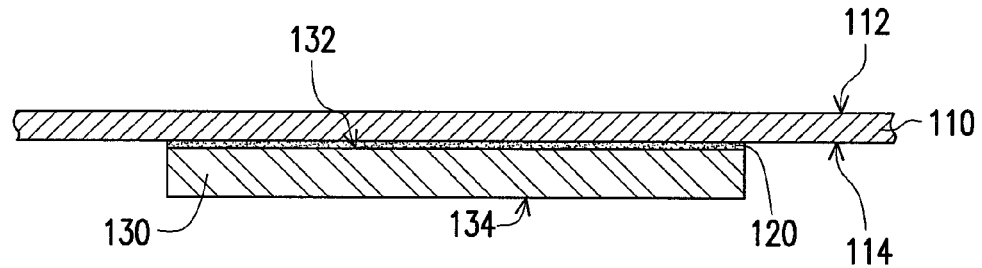
FIG. 2A to FIG. 2E are schematic cross-sectional views illustrating a method of manufacturing a semiconductor package structure according to an embodiment of the invention.

FIG. 1 is a schematic top view illustrating a semiconductor package structure according to an embodiment of the invention. FIG. 2A to FIG. 2E are schematic cross-sectional views illustrating a method of manufacturing a semiconductor package structure according to an embodiment of the invention. With reference to FIG. 2A, the method of manufacturing the semiconductor package structure in the present embodiment includes following steps. A conductive substrate 110 is provided. The conductive substrate 110 has a first surface 112 and a second surface 114 opposite to the first surface 112. Besides, the conductive substrate 110 is, for instance, made of metal, such as copper, copper alloy, Fe—Ni alloy, or any other appropriate metallic material. Certainly, the material of the conductive substrate 110 may be any other appropriate conductive material.

As indicated in FIG. 2A, a heat-conductive block 130 is adhered to a portion of the second surface 114 of the conductive substrate 110 via a first adhesive layer 120. Here, the first adhesive layer 120 is located between the heat-conductive block 130 and the conductive substrate 110, and the heat-conductive block 130 exposes a portion of the second surface 114 of the conductive substrate 110. Specifically, the heat-conductive block 130 described in the present embodiment has a first top surface 132 and a first bottom surface 134 opposite to the first top surface 132. The first top surface 132 connects the first adhesive layer 120, and the heat-conductive block 130 is, for instance, made of metal, such as copper, copper alloy, aluminum alloy, Fe—Ni alloy, or any other appropriate conductive material.

Figure 2B:
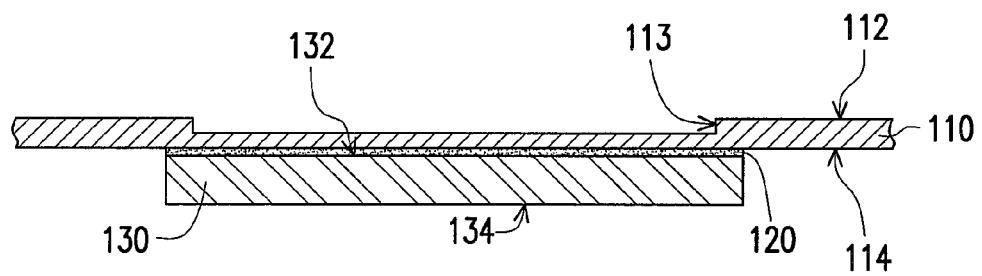

With reference to FIG. 2B, a portion of the conductive substrate 110 is removed by performing a half-etching process on the first surface 112 of the conductive substrate 110, and an opening 113 is formed on the first surface 112 of the conductive substrate 110. Here, a thickness of a portion of the conductive substrate 110 in the opening is less than a thickness of the original conductive substrate 110 (on which no half-etching process is performed).

Figure 2C:
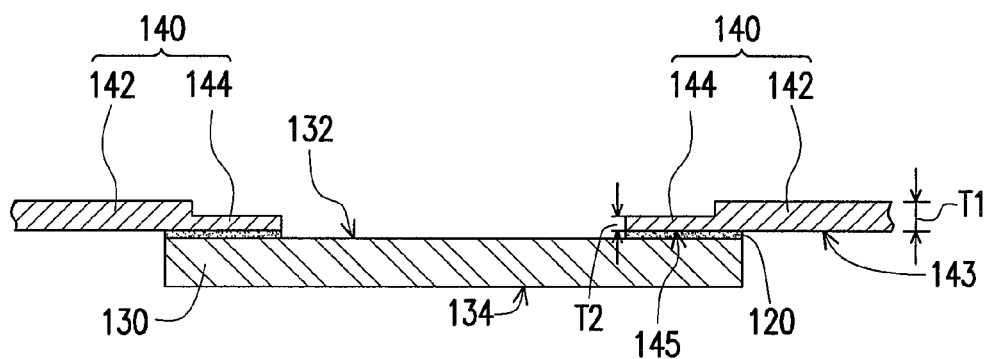

With reference to FIG. 1 and FIG. 2C, the remaining conductive substrate 110 is patterned to form a plurality of leads 140 electrically insulated form one another, and a portion of the heat-conductive block 130 (i.e., a portion of the first top surface 132 of the heat-conductive block 130) is exposed. Here, the remaining conductive substrate 110 is patterned through performing an etching process, for instance.

In particular, according to the present embodiment, each of the leads 140 has a first portion 142 and a second portion 144. A thickness T1 of the first portion 142 is greater than a thickness T2 of the second portion 144, and a first lower surface 143 of the first portion 142 and a second lower surface 145 of the second portion 144 are coplanar. Besides, in the present embodiment, a distance between the first portions 142 of any two adjacent leads 140 is P1, a distance between the second portions 144 of any two adjacent leads 140 is P2, and preferably $0.8\ P1 \leq P2 \leq 1.2\ P1$. Here, the distance P2 between the second portions 144 of any two adjacent leads 140, for instance, ranges from about 40 μm to about 60 μm, preferably from about 50 μm to about 60 μm. The distance P2 may be adjusted according to the distance between pads 152 of a chip and should not be construed as a limitation to the invention.

Figure 2D:
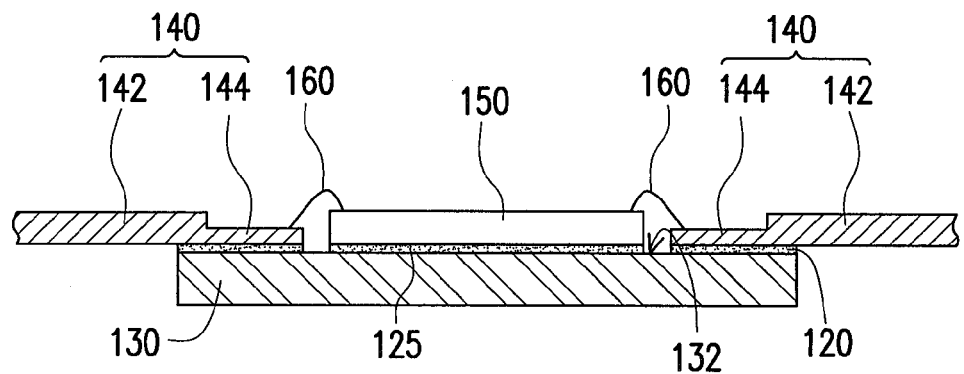

With reference to FIG. 1 and FIG. 2D, a chip 150 is disposed on the exposed portion of the heat-conductive block 130 (i.e., the exposed portion of the first top surface 132 of the heat-conductive block 130). Here, the second portions 144 of the leads 140 neighbor and surround the chip 150, and the chip 150 is electrically connected to the second portions 144 of the leads 140. In the present embodiment, the chip 150 is fixed to the exposed portion of the heat-conductive block 130 via a second adhesive layer 125. Namely, the second adhesive layer 125 is located between the exposed portion of the first top surface 132 of the heat-conductive block 130 and the chip 150, and the chip 150 is electrically connected to the second portions 144 of the leads 140 via a plurality of bonding wires 160.

Figure 2E:
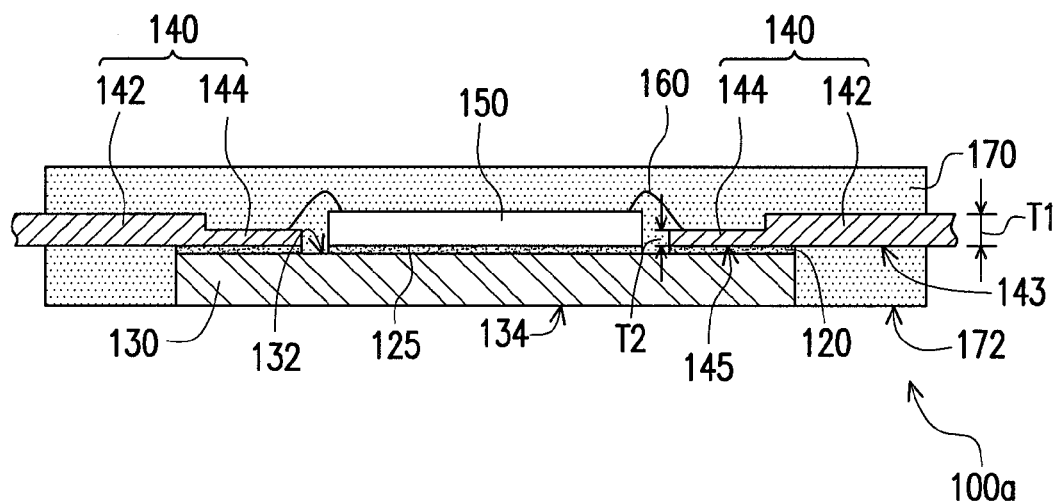

With reference to FIG. 1 and FIG. 2E, a molding compound 170 is formed to encapsulate the chip 150, a portion of the leads 140, and the exposed portion of the heat-conductive block 130, and space between the leads 140 is filled with the molding compound 170. The first bottom surface 134 of the heat-conductive block 130 and a second bottom surface 172 of the molding compound 170 are substantially coplanar. Certainly, in other embodiments not shown in the drawings, the first bottom surface 134 of the heat-conductive block 130 may be encapsulated by the molding compound 170. Preferably, the molding compound 170 exposes parts of the first portions 142 of the leads 140 to form a normal lead frame (as shown in FIG. 2E), or the leads 140 may not be exposed based on actual demands, so as to form a Quad Flat Non-leaded (QFN) structure (not shown). So far, the semiconductor package structure 100a is completely formed.

As shown in FIG. 2E, the semiconductor package structure 100a described in the present embodiment structurally includes the first adhesive layer 120, the second adhesive layer 125, the heat-conductive block 130, the leads 140, the chip 150, the bonding wires 160, and the molding compound 170. In particular, the heat-conductive block 130 has the first top surface 132 and the first bottom surface 134 opposite to the first top surface 132. The leads 140 are disposed on the first top surface 132 of the heat-conductive block 130 and expose a portion of the first top surface 132. In addition, the leads 140 are electrically insulated from one another, and each of the leads 140 has a first portion 142 and a second portion 144. The thickness T1 of the first portion 142 is greater than the thickness T2 of the second portion 144, and the first lower surface 143 of the first portion 142 and the second lower surface 145 of the second portion 144 are coplanar. The first adhesive layer 120 is disposed between the leads 140 and the heat-conductive block 130, and the leads 140 are fixed to the heat-conductive block 130 via the first adhesive layer 120. The chip 150 is disposed on the exposed portion of the first top surface 132 of the heat-conductive block 130. Here, the second portions 144 of the leads 140 neighbor and surround the chip 150. The chip 150 is fixed to the exposed portion of the first top surface 132 of the heat-conductive block 130 via the second adhesive layer 125 and is electrically connected to the second portions 144 of the leads 140. The molding compound 170 encapsulates the chip 150, a portion of the leads 140, and the exposed portion of the heat-conductive block 130. Here, the first bottom surface 134 of the heat-conductive block 130 is exposed by the molding compound 170, and the first bottom surface 134 of the heat-conductive block 130 and the second bottom surface 172 of the molding compound 170 are substantially coplanar.

According to the present embodiment, the half-etching process and the patterning process are performed on the conductive substrate 110 to form the leads 140 having the first and second portions 142 and 144, and the thickness T1 of the first portions 142 is greater than the thickness T2 of the second portions 144. As a consequence, when the chip 150 is disposed on the heat-conductive block 130, heat generated by the chip 150 may be rapidly transported to the external surroundings through the first bottom surface 134 of the heat-conductive block 130, which guarantees the favorable heat dissipation performance of the semiconductor package structure 100a described in the present embodiment. Moreover, owing to the design of the second portions 144 of the leads 140 neighboring and surrounding the chip 150, the chip 150 may be electrically connected to the second portions 144 of the leads 140 via the bonding wires 160 through wire bonding. As such, the distance of bonding wires between the chip 150 and the leads 140 may be effectively reduced during wire bonding, so as to preclude collapse of long wires or wire sweep, and product reliability can be effectively improved.

Figure 3A:
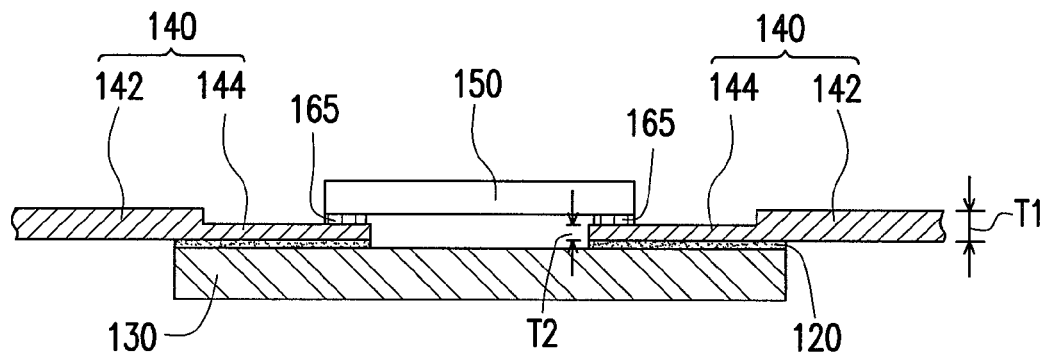
FIG. 3A to FIG. 3B are schematic cross-sectional views illustrating a method of manufacturing a semiconductor package structure according to another embodiment of the invention.
Figure 3B:
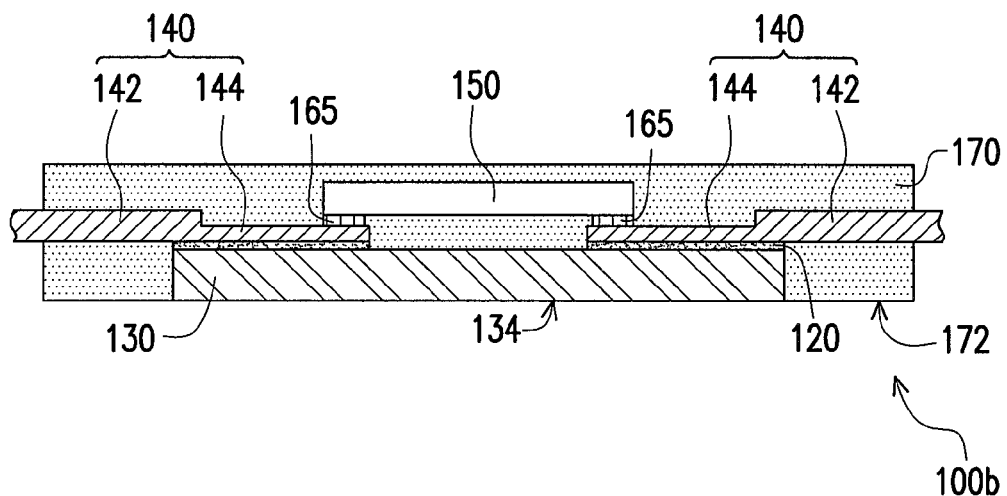

FIG. 3A to FIG. 3B are schematic cross-sectional views illustrating a method of manufacturing a semiconductor package structure according to another embodiment of the invention. Same reference numbers representing the same or similar components described in the previous embodiment are applied in the present embodiment, and repetitive explanation in the previous embodiment and in the present embodiment is omitted. For a precise description of this section, references which can be found in the previous embodiment are not provided hereinafter.

With reference to FIG. 3B, the main difference between the semiconductor package structure 100b described in the present embodiment and the semiconductor package structure 100a described in the previous embodiment lies in that the semiconductor package structure 100b further includes a plurality of bumps 165 disposed between the chip 150 and the second portions 144 of the leads 140. In addition, the chip 150 of the semiconductor package structure 100b is electrically connected to the second portions 144 of the leads 140 via the bumps 165 through flip chip bonding. In the present embodiment, the chip 150 is electrically connected to the second portions 144 of the leads 140 through flip chip bonding, and the thickness T2 of the second portions 144 of the leads 140 is less than the thickness T1 of the first portions 142. Hence, the thickness of the entire package can be effectively reduced, and thus the semiconductor package structure 100b can have a relatively small package thickness.

As to the manufacturing process, the semiconductor package structure 100b described in the present embodiment may be formed by conducting the manufacturing method similar to that of the semiconductor package structure 100a described in the previous embodiment. Besides, after performing the step shown in FIG. 2C, i.e., after patterning the remaining conductive substrate 110 to form the leads 140 electrically insulated from one another, the chip 150 is electrically connected to the second portions 144 of the leads 140 via the bumps 165 through flip chip bonding. The step shown in FIG. 2E is then carried out to complete the fabrication of the semiconductor package structure 100b.

The manufacturing methods shown in FIG. 2A to FIG. 2E and in FIG. 3A to FIG. 3B are merely exemplary, and some steps in these manufacturing methods are common to people having ordinary skill in the art pertinent to package. Based on actual conditions, those who have ordinary skill in the art can adjust, omit, or add manufacturing steps. For instance, plural heat-conductive blocks 130 may be arranged in array on the conductive substrate 110, and a singulation process is performed to form a plurality of semiconductor package structures 100a or 100b at the same time, so as to comply with the mass production requirement and the cost reduction demand. Detailed description thereof is omitted.

In light of the foregoing, as described in the embodiments of the invention, the half-etching process and the patterning process are performed on the conductive substrate to form the leads having the first and second portions, and the first and second portions have different thicknesses. Accordingly, when the chip is disposed on the heat-conductive block, the semiconductor package structure described in an embodiment of the invention can have favorable heat dissipation performance; what is more, the distance of bonding wires between the chip and the leads may be reduced during wire bonding due to the second portions of the leads neighboring and surrounding the chip. Thereby, the conventional issues of collapse of long wires or wire sweep can be resolved, and product reliability can be effectively improved. Moreover, when the chip is electrically connected to the second portions of the leads through flip chip bonding, the thickness of the package can be effectively reduced, such that the semiconductor package structure can have a relatively small package thickness.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of manufacturing a semiconductor package structure, comprising:
   providing a conductive substrate, the conductive substrate having a first surface and a second surface opposite to the first surface;
   adhering a heat-conductive block to a portion of the second surface of the conductive substrate via a first adhesive layer;
   after adhering the heat-conductive block to the portion of the second surface of the conductive substrate via the first adhesive layer, removing a portion of the conductive substrate by performing a half-etching process on the first surface of the conductive substrate to form an opening on the first surface of the conductive substrate;
   patterning the remaining conductive substrate to form a plurality of leads electrically insulated from one another and to expose a portion of the heat-conductive block, each of the plurality of leads having a first portion and a second portion, a thickness of each first portion being greater than a thickness of each second portion, a first lower surface of each first portion and a second lower surface of each second portion being coplanar;
   after patterning the remaining conductive substrate to form the plurality of leads electrically insulated from one another and exposing the portion of the heat-conductive block, disposing a chip on the exposed portion of the heat-conductive block, wherein the second portions of the plurality of leads neighbor and surround the chip, and the chip is electrically connected to the second portions of the plurality of leads; and
   forming a molding compound to encapsulate the chip, a portion of the plurality of leads, and the exposed portion of the heat-conductive block, and a bottom surface of the heat-conductive block is exposed by the molding compound.

2. The method as recited in claim 1, wherein a distance between the first portions of any two adjacent leads of the plurality of leads is P1, a distance between the corresponding second portions of any two adjacent leads of the plurality of leads is P2, and 0.8 P1≤P2≤1.2 P1.

3. The method as recited in claim 2, wherein the distance between the corresponding second portions of any two adjacent leads of the plurality of leads ranges from about 40 μm to about 60 μm.

4. The method as recited in claim 1, wherein the chip is electrically connected to the second portions of the plurality of leads via a plurality of bonding wires.

5. The method as recited in claim 1, wherein the chip is electrically connected to the second portions of the plurality of leads via a plurality of bumps.

6. A semiconductor package structure comprising:
a heat-conductive block having a first top surface and a first bottom surface opposite to the first top surface;
a plurality of leads disposed on the first top surface of the heat-conductive block and exposing a portion of the first top surface, the plurality of leads being electrically insulated from one another, each of the plurality of leads having a first portion and a second portion, a thickness of each first portion being greater than a thickness of each second portion, a first lower surface of each first portion and a second lower surface of each second portion being coplanar;
a first adhesive layer disposed between the plurality of leads and the heat-conductive block;
a chip disposed on the exposed portion of the first top surface of the heat-conductive block, wherein the second portions of the plurality of leads neighbor and surround the chip, and the chip is electrically connected to the second portions of the plurality of leads; and
a molding compound encapsulating the chip, a portion of the plurality of leads, and the exposed portion of the heat-conductive block, and the first bottom surface of the heat-conductive block is exposed by the molding compound.

7. The semiconductor package structure as recited in claim 6, wherein a distance between the first portions of any two adjacent leads of the plurality of leads is P1, a distance between the second portions of any two adjacent leads of the plurality of leads is P2, and $0.8\ P1 \leq P2 \leq 1.2\ P1$.

8. The semiconductor package structure as recited in claim 7, wherein the distance between the corresponding second portions of any two adjacent leads of the plurality of leads ranges from about 40 μm to about 60.

9. The semiconductor package structure as recited in claim 6, further comprising a plurality of bonding wires disposed between the chip and the second portions of the plurality of leads, wherein the chip is electrically connected to the second portions of the plurality of leads via the plurality of bonding wires.

10. The semiconductor package structure as recited in claim 6, further comprising a plurality of bumps disposed between the chip and the second portions of the plurality of leads, wherein the chip is electrically connected to the second portions of the plurality of leads via the plurality of bumps.

* * * * *